United States Patent [19]

Ushikawa

[11] Patent Number: 5,225,378
[45] Date of Patent: Jul. 6, 1993

[54] METHOD OF FORMING A PHOSPHORUS DOPED SILICON FILM

[75] Inventor: Harunori Ushikawa, Kofu, Japan

[73] Assignee: Tokyo Electron Limited, Tokyo, Japan

[21] Appl. No.: 775,618

[22] Filed: Oct. 15, 1991

[30] Foreign Application Priority Data

Nov. 16, 1990 [JP] Japan .................. 2-310632

[51] Int. Cl.⁵ .................. H01L 21/00; H01L 21/02; H01L 21/20; H01L 21/205
[52] U.S. Cl. .................. 437/233; 437/225; 437/228; 118/620; 118/715; 427/587; 427/588
[58] Field of Search .................. 437/225, 228, 233; 118/715, 620; 148/DIG. 122; 427/587, 588

[56] References Cited

U.S. PATENT DOCUMENTS

| | | | |
|---|---|---|---|
| 4,400,409 | 8/1983 | Izu et al. | 437/233 |
| 4,461,783 | 7/1984 | Yamazaki | 427/588 |
| 4,716,852 | 1/1988 | Tsujii et al. | 118/715 |
| 4,818,563 | 4/1989 | Ishihara et al. | 427/588 |
| 4,818,711 | 4/1989 | Choksi et al. | 437/233 |
| 5,013,675 | 5/1991 | Shen et al. | 437/233 |

FOREIGN PATENT DOCUMENTS

| | | | |
|---|---|---|---|
| 0143701 | 6/1985 | European Pat. Off. | |
| 0187935 | 11/1982 | Japan | 437/233 |
| 0052879 | 3/1984 | Japan | |
| 0025967 | 2/1991 | Japan | |
| 0061225 | 2/1992 | Japan | |

*Primary Examiner*—Brian E. Hearn
*Assistant Examiner*—B. Everhart
*Attorney, Agent, or Firm*—Oblon, Spivak, McClelland, Maier & Neustadt

[57] ABSTRACT

Phosphor-doped silicon films are simultaneously formed on semiconductor wafers, respectively. The semiconductor wafers are contained in a reaction tube whose interior temperature is controlled to 500° C. $Si_2H_6$ and $PH_3$ are introduced into the reaction tube. $PH_3$ is preheated to 400° C. in a gas activating unit before being introduced into the reaction tube. By virtue of the preheating, the thermal decomposition of $PH_3$ carried out in the reaction tube is accelerated.

18 Claims, 5 Drawing Sheets

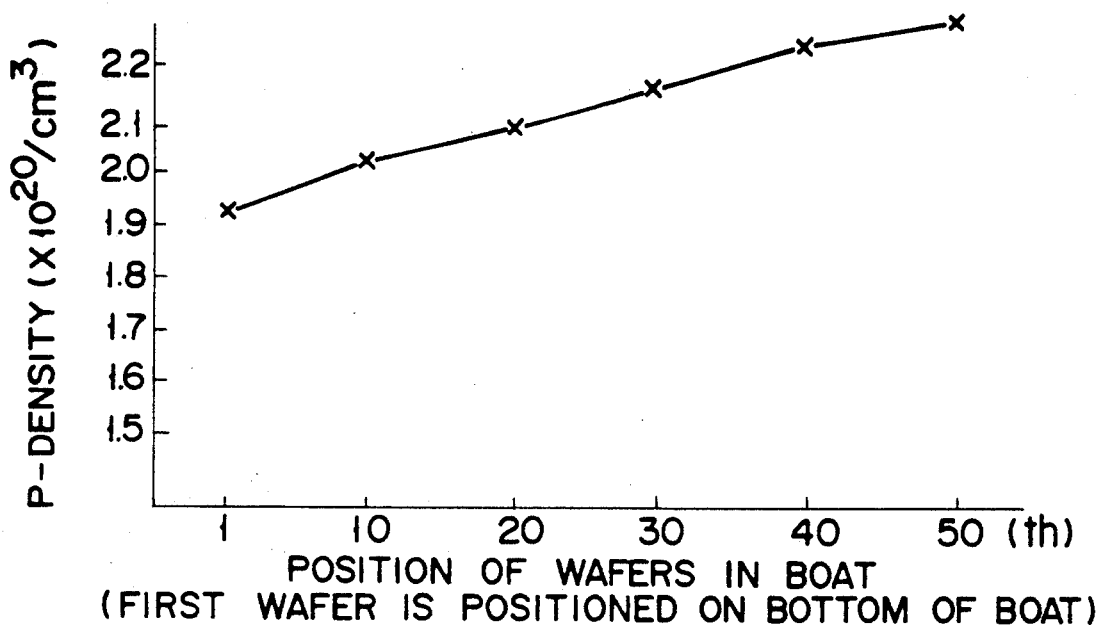
F I G. 5
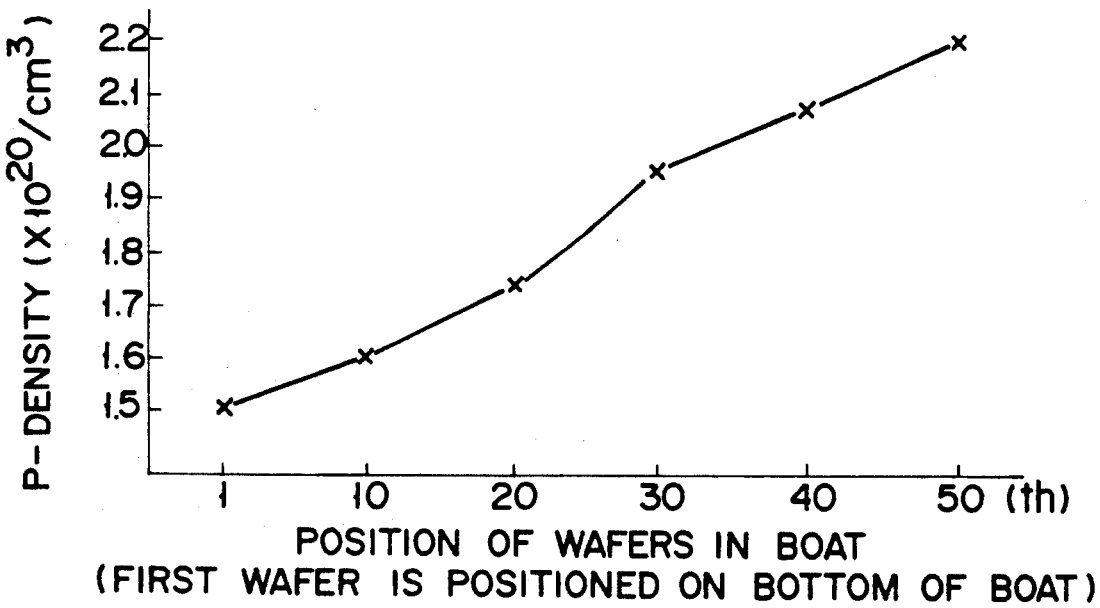
F I G. 6

METHOD OF FORMING A PHOSPHORUS DOPED SILICON FILM

BACKGROUND OF THE INVENTION

Field of the Invention

This invention relates to a method of forming a semiconductor film, and more particularly to a CVD (Chemical Vapor Deposition) method.

Description of the Related Art

It is known to form a phosphor-doped polysilicon film in an LPCVD apparatus by introducing phosphine ($PH_3$) in a reaction tube during growing the film so as to dope the film with phosphor (P).

As a technique of enhancing the uniformity of the thickness of a film, it is disclosed in Published Unexamined Japanese Patent Applications Nos. 58-108735 and 61-201695 to prepare a quartz ring having a diameter larger than a semiconductor wafer, and to form a film on the wafer in a state where the wafer is in tight contact with the ring.

To form a phosphor-doped silicon film by using treatment gases such as disilane ($Si_2H_6$) and phosphine ($PH_3$) gases, the film is grown usually in a heat treatment apparatus uniformly heated at approx. 500° C. in consideration of disilane. This is because the film is grown uniformly on a wafer at 500° C. such that the growth rate of the film depends on the reaction rate of $Si_2H_6$.

If, on the other hand, the heating temperature is set to a high value, e.g. 550° C., the growth rate of the film depends on the supply rate of $Si_2H_6$ which reacts actively at the temperature. Under this condition, that edge portion of a wafer to which a greater amount of $Si_2H_6$ is supplied than the other portions will inevitably have a film thickness greater than the other portions, resulting in a film of nonuniform thickness. Although this can be improved to some extent by using the above-mentioned quartz ring, sufficient uniformity cannot be obtained.

However, the decomposition temperature of $Si_2H_6$ is approx. 330° C., whereas that of $PH_3$ is approx. 380° C. Further, the decomposition speed of $PH_3$ is very low at 500° C. Thus, where a phosphor-doped polysilicon film is grown at 500° C. at which $Si_2H_6$ can work effectively, the other treatment gas, i.e., $PH_3$, has different thermal decomposition degrees at different places in the treatment vessel. Specifically, in a case where $PH_3$ is introduced into the heated vessel from one end thereof, and exhausted from the other end, the gas supplied in the vicinity of the inlet side is not sufficiently decomposed, as compared with the outlet side. Therefore, a wafer placed on the inlet side will be coated with a film containing phosphor of low density. This is very disadvantageous to carry out a batch-type treatment, since uniformity in composition and thickness between films formed on wafers placed in various portions of the treatment vessel will unavoidably be degraded.

SUMMARY OF THE INVENTION

It is an object of the invention to provide a semiconductor film-forming method which can form a semiconductor film of uniform thickness on a substrate even by using a plurality of treatment gases whose thermal decomposition temperatures differ from one another.

It is another object of the invention to provide a semiconductor film-forming method which can form films of uniform thickness and composition on wafers subjected to a batch-type treatment, even by using a plurality of treatment gases whose thermal decomposition temperatures differ from one another.

According to a first aspect of the invention, the method of forming a semiconductor film on a substrate comprises the steps of: heating a reaction tube; loading the substrate in the reaction tube; supplying a first treatment gas into the reaction tube; and supplying a second treatment gas into the reaction tube, the thermal decomposition temperature of the second treatment gas being higher than that of the first treatment gas; wherein the second treatment gas is activated before being supplied to the reaction tube.

According to a second aspect of the invention, the method of forming a semiconductor film on a substrate comprises the steps of: heating a reaction tube; loading the substrate in the reaction tube; supplying a first treatment gas into the reaction tube, the first treatment gas providing a main material of the semiconductor film as a result of decomposition thereof; and supplying a second treatment gas into the reaction tube, the second treatment gas providing an impurity, with which the semiconductor film is doped, as a result of decomposition thereof; wherein the second treatment gas is activated before being supplied to the reaction tube.

The activation of the second treatment gas is performed by applying heat or light thereto, or by generating plasma thereof.

In the invention, the interior of the reaction tube is heated to a temperature at which the first treatment gas is thermally decomposed. The second treatment gas whose decomposition temperature is higher than that of the first treatment gas is preactivated by mean of a gas activating unit. Thus the second treatment gas is sufficiently decomposed to allow a film to uniformly grow on a substrate, or films to simultaneously and uniformly grow on respective substrates.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a graph showing the relationship between phosphor density characteristics and a wafer position in a case where gas preheating is performed; and FIG. 6 is a graph showing the relationship between phosphor density characteristics and a wafer position in a case where gas preheating is not performed.

DETAILED DESCRIPTION OF THE PREFERRED EMBODIMENT

This invention will be explained with reference to the accompanying drawings showing an embodiment thereof.

Figure 1:
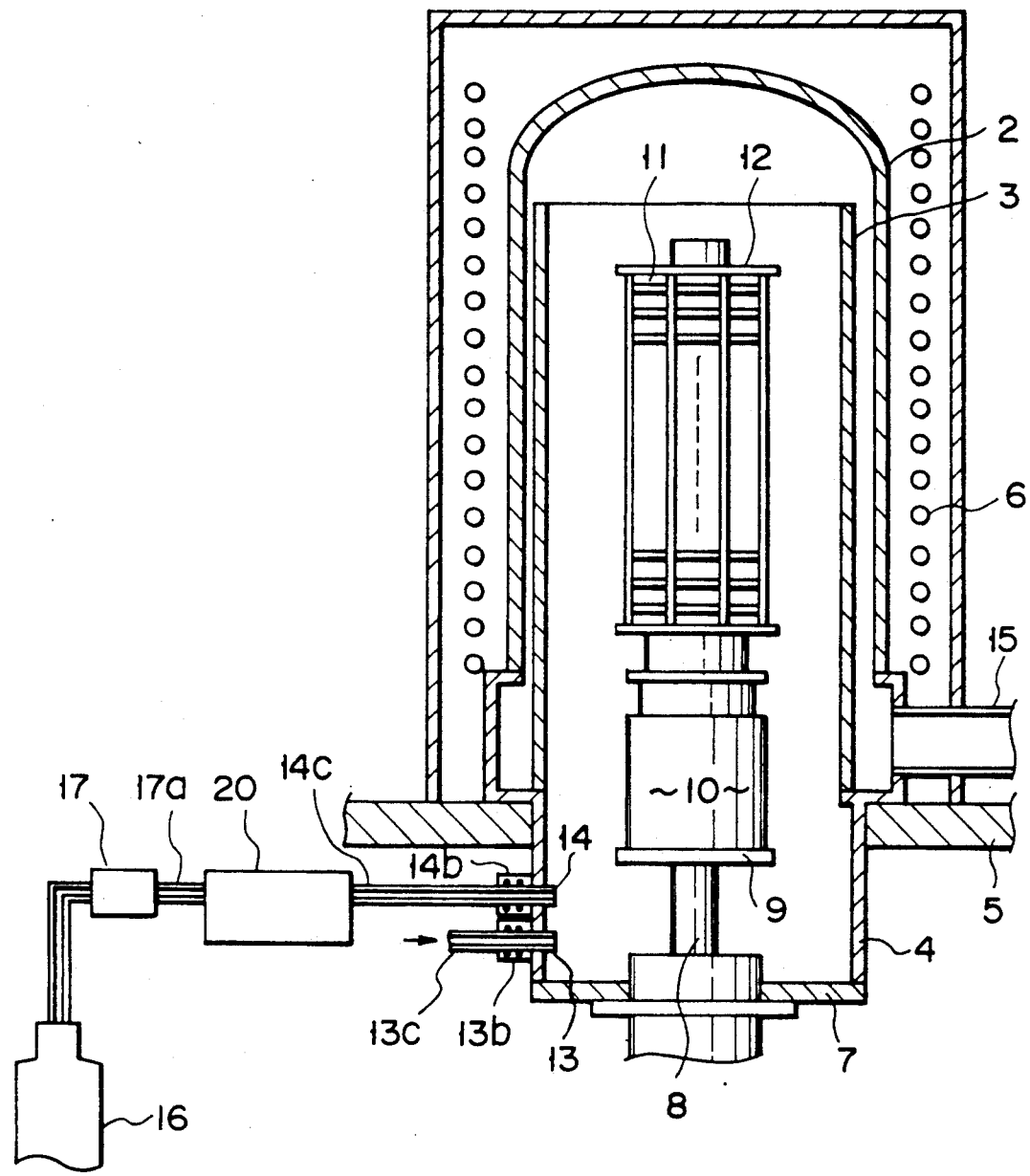
FIG. 1 is a partial longitudinal sectional view of a CVD apparatus according to the invention.

The vertical CVD apparatus shown in FIG. 1 has a cylindrical reaction tube 1 arranged in the longitudinal or vertical direction and having a double-tube structure comprising an outer tube 2 made of a thermal resistive material such as quartz, and an inner tube 3 coaxially arranged in the outer tube 2 and made of e.g. quartz.

The outer and inner tubes 2 and 3 are held by a manifold 4 made of e.g. stainless steel and fixed to a base plate 5. A heat treatment unit formed of a cylindrical heater 6 made of e.g. a heating resistor surrounds the reaction tube 1 so as to form a uniformly heating area of 500°–1200° C. therein.

The manifold 4 has a bottom opening which can be sealed in a hermetic manner by means of a disk-like cap unit 7 made of e.g. stainless steel, with an elastic O-ring (not shown) interposed.

A rotary shaft 8 is inserted in a substantially central portion of the cap unit 7 such that it can rotate in a hermetic manner by the use of e.g. a magnetic seal. The rotary shaft 8 has a lower end (not shown) connected to a rotating mechanism (not shown), and an upper end secured to a turn table 9 made of stainless steel or so.

A heat insulation cylinder 10 made of quartz is located on the turn table 9 in the inner tube 3, with a predetermined interval therefrom. A wafer boat 12 made of e.g. quartz is placed on the upper surface of the heat insulation cylinder 10, that is, it is placed in the uniformly heated area by means of the cylinder 10. The boat 12 can receive a plurality of semiconductor wafers 11, e.g. 50 wafers (the object to be treated is not limited to a semiconductor wafer, but may be other things such as a glass substrate etc.), stacked above one another with a predetermined space (e.g. 13 mm) therebetween.

The wafer boat 12, heat insulation tube 10, turn table 9, and cap unit 7 are integrally loaded into the reaction tube 1 from under and unloaded from the tube, by means of ascending/descending mechanism (not shown) consisting of e.g. a boat elevator.

A gas guide pipe 13 made of e.g. quartz is inserted into the reaction tube 1 through a lower portion of a side wall of the manifold 4. A sealing member 13b is provided at the insertion portion of the pipe 13, for preventing leakage of gas. The guide pipe 13 is connected to a gas pipe 13c made of e.g. stainless steel. The gas pipe 13c is connected to a gas supply source (not shown). Treatment gases such as disilane ($Si_2H_6$) and nitrogen ($N_2$) are supplied from the gas supply source to the reaction tube 1 through the first gas guide pipe 13.

Further, there is provided a second gas guide pipe 14 for introducing into the reaction pipe 1 an organic compound gas, e.g. phosphine gas ($PH_3$) containing phospher (P) as a dope element or another organic compound gas containing another dope element, such as boron (B) or arsenic (As). The pipe 14 is secured in a hermetic manner to a lower portion of the manifold 4 by the use of a sealing member 14b.

The second gas guide pipe 14 is connected to a gas supply source 16. An MFC. 17 serving as gas flow regulator and a heat-emitting type gas activating unit 20 for activating gas are arranged on the guide pipe 14. The unit 20 heats $PH_3$ to a predetermined temperature, thereby activating it before introducing it into the reaction tube 1. Thus, the guide pipe 14 can supply $PH_3$ preheated to the predetermined temperature into the tube 1.

Figure 2:
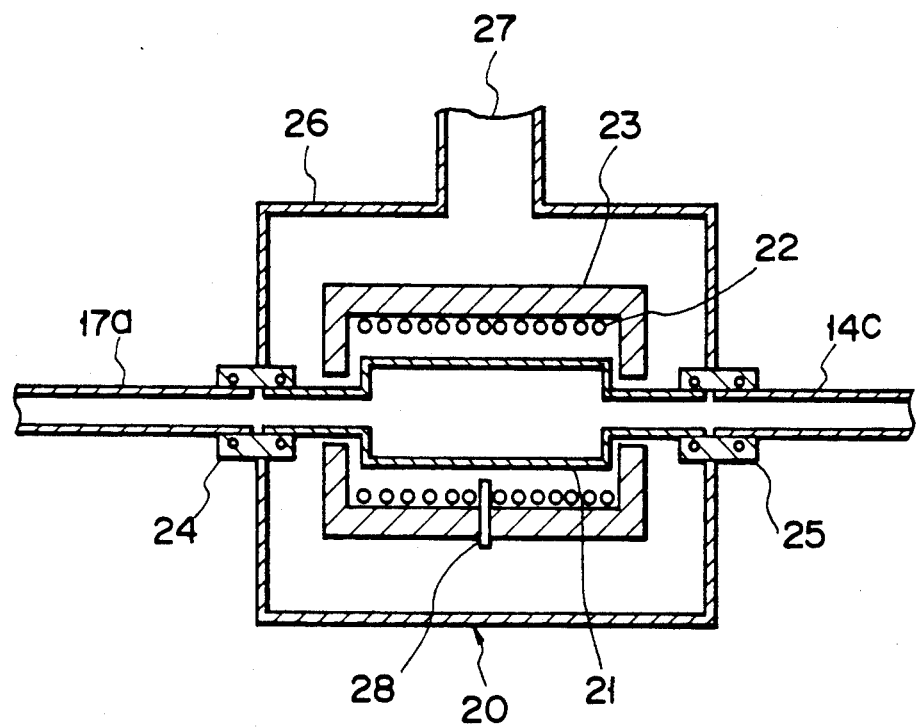
FIG. 2 is a schematic sectional view of a heat-emitting type gas-activating unit.

As is shown in FIG. 2, the gas activating unit 20 has a cylindrical heater vessel 21 made of a thermal resistive material, e.g. quartz, a heating resistor 22 surrounding the vessel 21, and a heat insulation member 23 for preventing outgoing radiation of heat from the resistor 22.

A temperature detector 28 is arranged in the vicinity of the heating resistor 22, and is controlled by a control unit (not shown) to apply a voltage to the resistor 22 so as to keep the temperature of the interior of the heating vessel 21 at a predetermined value.

The vessel 21 has an end connected, by means of a sealing member 23, to a pipe 17a for supplying the vessel with the treatment gas ($PH_3$ gas) whose flow is adjusted through the MFC. 17.

The other end of the vessel 21 is connected, by means of a sealing member 25, to a pipe 14c for supplying the second gas guide pipe 14 with the treatment gas ($PH_3$ gas) preheated up to the predetermined temperature.

The heating vessel 21, heating resistor or heater 22, heat insulation member 23 are received in a case 26. The case 26 has an upper end portion connected to exhaust pipe 27 connected to an exhaust device (not shown). Thus, even if the heating vessel 21 breaks and poisonous $PH_3$ gas flows therefrom, the gas is exhausted through the exhaust pipe 27, thereby preventing the gas from being leaked from the case 26.

Further, the manifold 4 has an upper side portion connected to an exhaust pipe 15 leading to an exhaust system (not shown) such as a vacuum pump. The treatment gases existing between the outer and inner tubes 2 and 3 are exhausted through the pipe 15 so as to put the interior of the reaction tube 1 under a predetermined vacuum pressure.

It is very advantageous for realizing the invention to provide such a safety mechanism as comprises interlock valves provided on the pipes 14c and 17a, respectively, and to be adapted to close and open in response to electric signals, and as has the construction that the interlock valves close if the pressure in the reaction tube 1 is more than 1 Torr, thereby ensuring the safety of the entire apparatus even in a case the heating vessel 21 is broken.

The first and second gas guide pipes 13 and 14 are preferably configurated linear. Each of the pipes 13 and 14 may comprise a plurality of pipes, in which structure all the pipes serving as the second gas guide pipe 14 must pass through the gas activating unit.

If $PH_3$ is preheated to 200° C. or more in the gas activating unit shown in FIG. 2, the advantage of the invention will be obtained. If, however, it is preheated up to about 400° C. in consideration of the decomposition temperature difference (about 50° C.) between $PH_3$ and $Si_2H_6$, the uniformity in the phosphor density of the films coated on wafers will be further enhanced.

In addition, in a case where other treatment gases such as $N_2O$ and $SiH_4$ gases are used for growing a film, if $N_2O$ gas is preheated to 700° C. in the gas activating unit 20, and a film is grown in the reaction tube 1 at e.g. 780° C., a resultant film can have the same quality and thickness as in a case where the interior of the tube 1 is set at 800° C.

Figure 3:
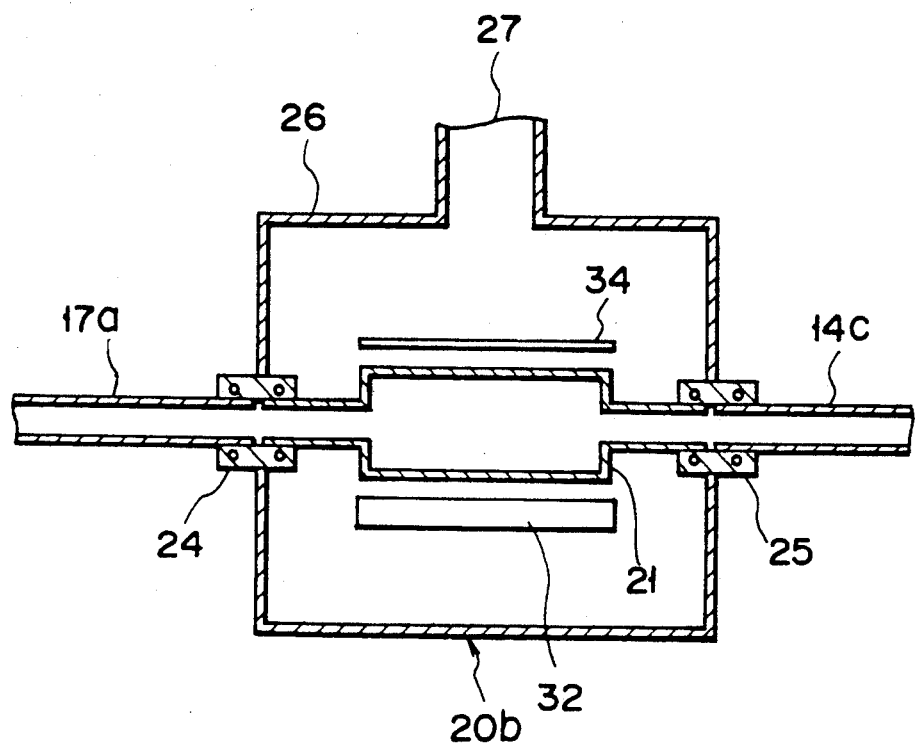
FIG. 3 is a schematic sectional view of a light-emitting type gas-activating unit.

A light-emitting type gas activating unit may be used as the gas activating unit in place of the heat-emitting activating unit 20 consisting of a heating resistor 22. In this case, a heavy hydrogen lamp, an ArF excimer laser, etc. can be used as a light source, since PH$_3$ gas has an absorption edge of 200 nm or less. FIG. 3 shows a light-emitting type gas activating unit 20b in which a heating vessel 21 is interposed between a reflector plate 34 and a deuterium lamp 32. If the flow of PH$_3$ gas is set at 100 SCCM in the heating vessel 21, the intensity of light is set at about 100 W.

Figure 4:
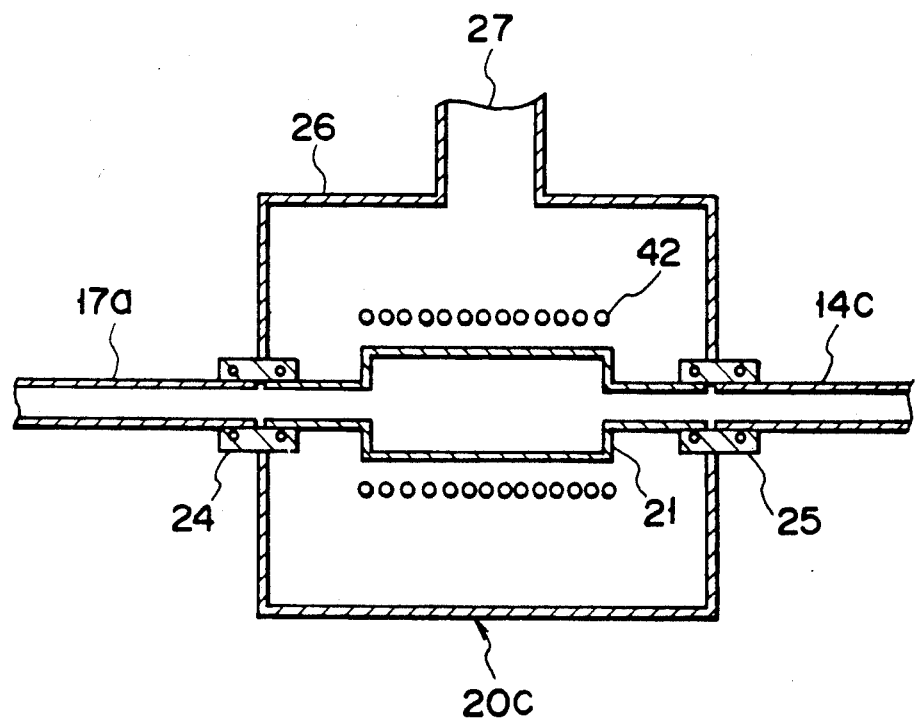
FIG. 4 is a schematic sectional view of a plasma-generating type gas-activating unit.

A plasma-generation type gas activating unit 20c, as shown in FIG. 4, may be also used as the gas activating unit. If the flow of PH$_3$ gas is set at 100 SCCM, a desired condition for generating plasma is 13.56 MHz and 10 W.

In FIGS. 3 and 4, the same reference numerals as those in FIG. 2 indicate the same elements as those in FIG. 2, and hence explanation of the elements is omitted.

EXAMPLE

A P-doped silicon film was formed by the use of the CVD apparatus shown in FIG. 1 incorporating the gas activating unit 20 shown in FIG. 2.

The wafer boat 12 containing a plurality of wafers 11, e.g. 60 wafers, was loaded into the reaction tube 1 from under by means of a boat elevator (not shown). The object-treating area in the tube 1 was kept at e.g. 500° C. by the heater 6.

Then, after air was exhausted from the reaction tube 1 until the interior thereof was set to a predetermined degree of vacuum, film growing gases such as Si$_2$H$_6$ (80 SCCM) and N$_2$ (120 SCCM) were introduced into the inner tube 3 through the first gas guide pipe 13. A mixture containing 1% of PH$_3$ and 99% of He was supplied to the wafers 11 through the second gas guide pipe 14. The flow of the mixture was controlled to produce films having a desired phosphor density at the time of growing the films on the semiconductor wafers 11 contained in a lower portion of the wafer boat 12. The mixture was preheated up to 400° C. (at least 200° C. or more) in the gas activating unit 20. The pressure in the reaction tube 1 was controlled by exhausting air therein to be set at a value falling within a range of 0.1–0.3 Torr, and preferably at 0.2 Torr. The wafers 11 were treated under these conditions for 120 minutes, and thus had P-doped silicon films grown thereon and having a thickness of 300 nm.

The P densities of the silicon films grown on 50 wafers fell within a range of about $1.9 \times 10^{20}/cm^3$ about $2.2 \times 10^{20}/cm^3$. That is, the variation fell within a range of ±10%, which means that uniform films were obtained. Such a uniformity can be obtained by implanting phosphor of a density falling within a range of $1.0-5.0 \times 10^{20}/cm^3$.

COMPARATIVE EXAMPLE

To ensure the advantage of the invention, another experiment was performed under the same conditions as the invention except that PH$_3$ was not preheated. In this case, as is shown in FIG. 6, a film formed on the wafer placed at the lowest position of the wafer boat had a P density of $1.5 \times 10^{20}/cm^3$, whereas a film formed on the wafer placed at the upper position had a P density of $2.2 \times 10^{20}/cm^3$. That is, a variation in P density fell within a range of approx. ±20%, which indicated non-uniformity of the P density.

The reason why the P density will not become uniform if gas preheating is not carried out is considered as follows:

PH$_3$ gas supplied to a wafer placed at a lower portion of the wafer boat is not sufficiently heated, and hence it is not well decomposed, which causes the P density of a film formed on the wafer to be lower than that of a film formed on a wafer placed at an upper portion of the boat, since the gas supplied to the wafer placed at the upper portion is sufficiently heated and decomposed while passing the heating area of 500° C. in the tube 1 from the lower portion to the upper portion of the area.

In the above-described embodiment of the invention, gas is preheated at a high temperature, since the temperature at which a film is formed is high. It is needless to say that the preheating temperature is low if the film-growing temperature is low. Further, though the method of the invention is applied for producing a semiconductor film in the embodiment, it may be applied to an apparatus or process for forming a metal film, an insulation film, or an oxide film, or for forming a diffusion layer.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a semiconductor film on a substrate, comprising the steps of:
   preparing first and second process gases, each of which provides a component of the film upon decomposition, the second process gas having a thermal decomposition temperature higher than that of the first process gas;
   heating a process chamber by irradiating the process chamber with heat from a first heating resistor at an appropriate temperature for decomposing the first process gas;
   loading the substrate in the process chamber;
   supplying the first process gas into the process chamber through a first conduit;
   supplying the second process gas into the process chamber through a second conduit;
   heating the second process gas in the second conduit by irradiating the second conduit with heat from a second heating resistor before introducing it into the process chamber; and
   reacting in the process chamber the component of the film derived from the first process gas upon decomposition with the other component of the film derived from the second process gas upon decomposition, thereby forming the film on the substrate.

2. The method according to claim 1, further comprising the steps of:
   hermetically covering with a case the second heating resistor and a portion of the second conduit in which the second process gas is heated;
   connecting exhausting means to the case; and
   exhausting the case by the exhausting means while heating the second process gas by the second heating resistor.

3. The method according to claim 2, wherein said portion of the second conduit is made of quartz, and the second heating resistor is located around said portion.

4. The method according to claim 3, wherein a plurality of substrates are processed in the process chamber at the same time.

5. A method of forming a semiconductor film doped with an impurity on a substrate, comprising the steps of:

preparing a first process gas which provides a main component of the film upon decomposition, and a second process gas which provides the impurity upon decomposition, the first and second process gases having different thermal decomposition temperatures;

heating a process chamber by irradiating the process chamber with heat from a first heating resistor at an appropriate temperature for decomposing one of the process gases which has a lower thermal decomposition temperature;

loading the substrate in the process chamber;

supplying said one of the process gases into the process chamber through a first conduit;

supplying the other of the process gases which has a higher thermal decomposition temperature into the process chamber through a second conduit; and heating said other process gas in the second conduit by irradiating the second conduit with heat from a second heating resistor before introducing it into the process chamber; and depositing on the substrate the main component of the film derived from the first process gas upon decomposition while doping the main component with the impurity derived from the second process gas upon decomposition, thereby forming the film doped with the impurity on the substrate.

6. The method according to claim 5, further comprising the steps of:

hermetically covering with a case the second heating resistor and a portion of the second conduit in which said other process gas is heated;

connecting exhausting means to the case; and exhausting the case by the exhausting means while heating said other process gas by the second heating resistor.

7. The method according to claim 6, wherein said portion of the second conduit is made of quartz, and the second heating resistor is located around said portion.

8. The method according to claim 6, wherein the second process gas has a thermal decomposition temperature higher than that of the first process gas.

9. The method according to claim 8, wherein the first process gas is $Si_2H_6$, and the second process gas is $PH_3$.

10. The method according to claim 9, wherein the appropriate temperature at which the process chamber is heated is about 500° C.

11. The method according to claim 10, wherein the $PH_3$ is heated upon to 200° C. or more in the second conduit.

12. The method according to claim 11, wherein the $PH_3$ is heated up to about 400° C. in the second conduit.

13. The method according to claim 12, wherein a plurality of substrates are processed in the process chamber at the same time.

14. The method according to claim 3, wherein the first and second process gases are $SiH_4$ and $N_2O$, respectively.

15. The method according to claim 4, wherein the plurality of substrates are arranged vertically stacked with intervals therebetween.

16. The method according to claim 15, wherein the first and second conduits are connected to the process chamber at its lower portions, said conduits being close to each other.

17. The method according to claim 13, wherein the plurality of substrates are arranged vertically stacked with intervals therebetween.

18. The method according to claim 17, wherein the first and second conduits are connected to the process chamber at its lower portions, said conduits being close to each other.

* * * * *